US009653167B2

(12) United States Patent
Takekida

(10) Patent No.: US 9,653,167 B2
(45) Date of Patent: May 16, 2017

(54) SEMICONDUCTOR MEMORY DEVICE USING GROUNDED DUMMY BIT LINES

(71) Applicant: Kabushiki Kaisha Toshiba, Minato-ku (JP)

(72) Inventor: Hideto Takekida, Nagoya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/687,177

(22) Filed: Apr. 15, 2015

(65) Prior Publication Data

US 2016/0247571 A1 Aug. 25, 2016

Related U.S. Application Data

(60) Provisional application No. 62/118,334, filed on Feb. 19, 2015.

(51) Int. Cl.
| | |
|---|---|
| *G11C 16/06* | (2006.01) |
| *G11C 7/02* | (2006.01) |
| *G11C 7/18* | (2006.01) |
| *G11C 16/04* | (2006.01) |
| *H01L 27/11519* | (2017.01) |
| *H01L 27/11524* | (2017.01) |

(52) U.S. Cl.
CPC .............. *G11C 16/06* (2013.01); *G11C 7/02* (2013.01); *G11C 7/18* (2013.01); *G11C 16/0483* (2013.01); *H01L 27/11519* (2013.01); *H01L 27/11524* (2013.01)

(58) Field of Classification Search
CPC ....... G11C 16/06; G11C 16/0483; G11C 7/02; G11C 7/18; H01L 27/115
See application file for complete search history.

(56) References Cited

U.S. PATENT DOCUMENTS

| 8,315,094 | B2 | 11/2012 | Kanda et al. | |
|---|---|---|---|---|
| 9,202,581 | B1 * | 12/2015 | Kamei | .................. G11C 16/26 |
| 2007/0285985 | A1 * | 12/2007 | Kwak | ................ G11C 16/3418 |
| | | | | 365/185.17 |

(Continued)

FOREIGN PATENT DOCUMENTS

| JP | 2011-119530 | 6/2011 |
|---|---|---|
| JP | 2013-065638 | 4/2013 |
| JP | 2014-038882 | 2/2014 |

*Primary Examiner* — Vanthu Nguyen
*Assistant Examiner* — Jerome Leboeuf
(74) *Attorney, Agent, or Firm* — Oblon, McClelland, Maier & Neustadt, L.L.P.

(57) ABSTRACT

A semiconductor memory device according to an embodiment comprises a memory cell array including first and second wiring line layers disposed sequentially above memory cells, the first wiring line layer including a first wiring line and a first dummy wiring line, and the second wiring line layer including a second wiring line and a second dummy wiring line, the second wiring line being disposed at the same position in the first direction as the first dummy wiring line, the second dummy wiring line being disposed at the same position in the first direction as the first wiring line, and during an access operation by a control circuit, the first and second wiring lines being electrically connected to at least one of the memory cells, and the first and second dummy wiring lines being fixed at a certain first potential.

20 Claims, 21 Drawing Sheets

(56) References Cited

U.S. PATENT DOCUMENTS

| | | | |
|---|---|---|---|
| 2008/0025103 A1* | 1/2008 | Dudeck | G11C 7/062 365/185.25 |
| 2013/0070506 A1 | 3/2013 | Kajigaya | |
| 2014/0043902 A1 | 2/2014 | Unno | |

* cited by examiner

SEMICONDUCTOR MEMORY DEVICE USING GROUNDED DUMMY BIT LINES

CROSS-REFERENCE TO RELATED APPLICATIONS

This application is based upon and claims the benefit of priority from the prior U.S. Provisional Application 62/118,334, filed on Feb. 19, 2015, the entire contents of which are incorporated herein by reference.

BACKGROUND

Field

An embodiment of the present invention relates to a semiconductor memory device and a production method thereof.

Description of the Related Art

One kind of semiconductor memory device is a flash memory. Generally, a NAND type flash memory in particular is widely used since it is low cost and has a large capacity. Moreover, up to now, many technologies for further increasing the capacity of this NAND type flash memory have been proposed. One such technology is miniaturization of a select wiring line of a memory cell.

DETAILED DESCRIPTION

A semiconductor memory device according to an embodiment comprises: in the case that three directions intersecting each other are assumed to be a first direction, a second direction, and a third direction, a memory cell array including a plurality of memory cells and a first wiring line layer and second wiring line layer disposed sequentially above the memory cells in the third direction, the first wiring line layer including a first wiring line and a first dummy wiring line that are aligned in the first direction and have the second direction as a longer direction, and the second wiring line layer including a second wiring line and a second dummy wiring line that are aligned in the first direction and have the second direction as a longer direction; and a control circuit that controls an access operation on the memory cells, the second wiring line being disposed at the same position in the first direction as the first dummy wiring line, the second dummy wiring line being disposed at the same position in the first direction as the first wiring line, and during an access operation by the control circuit, the first wiring line and the second wiring line being electrically connected to at least one of the memory cells, and the first dummy wiring line and the second dummy wiring line being fixed at a certain first potential.

A semiconductor memory device and production method thereof according to an embodiment will be described below with reference to the drawings.

[Configuration and Structure of Semiconductor Memory Device According to Embodiment]

First, an overall configuration of a semiconductor memory device according to the present embodiment will be described. Note that a NAND type flash memory will be described below as an example.

Figure 1:
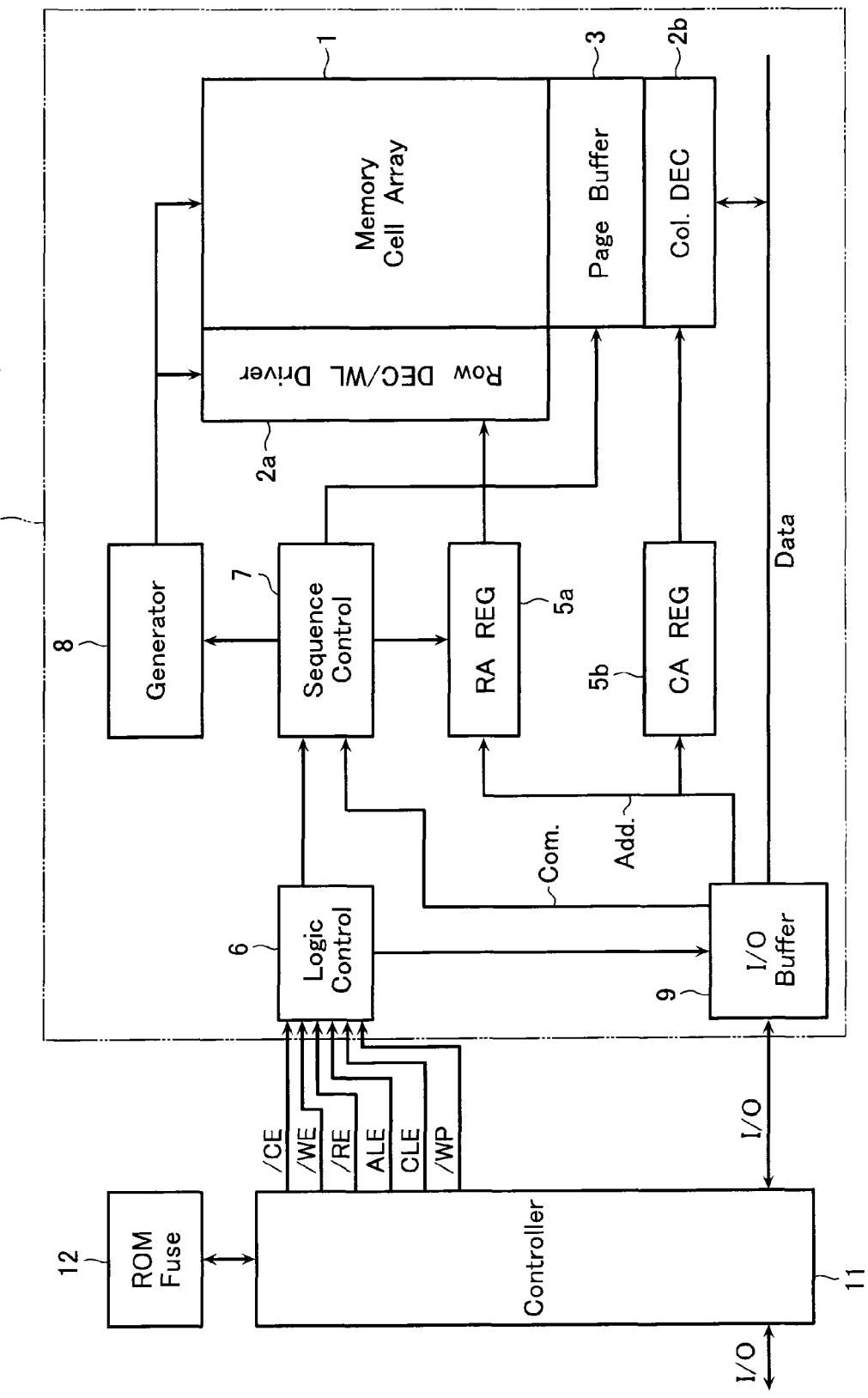
FIG. 1 is a view showing functional blocks of a semiconductor memory device according to an embodiment.

FIG. 1 is a functional block diagram of the semiconductor memory device according to the present embodiment.

This flash memory comprises: a NAND chip 10; a controller 11 that controls this NAND chip 10; and a ROM fuse 12 that stores various kinds of information required for an access operation on the NAND chip 10.

The NAND chip 10 comprises a memory cell array 1. The memory cell array 1 includes a plurality of bit lines extending in a column direction, a plurality of word lines and a source line extending in a row direction, and a plurality of memory cells selected by the bit line and the word line. The memory cell array 1 will be described in detail later. Note that in the description below, a group of memory cells selected by one word line is sometimes also referred to as a page.

In addition, the NAND chip 10 comprises a control unit that controls an access operation on the memory cell. The control unit includes: a row decoder/word line driver 2a; a column decoder 2b; a page buffer 3; a row address register 5a and column address register 5b; a logic control circuit 6; a sequence control circuit 7; a voltage generating circuit 8; and an I/O buffer 9.

The row decoder/word line driver 2a drives the word line and a later-to-be-described select gate line of the memory cell array 1. The page buffer 3 includes a one page portion of sense amplifier circuits and data holding circuits. A one page portion of read data stored by the page buffer 3 is sequentially column selected by the column decoder 2b to be outputted to an external I/O terminal via the I/O buffer 9. Write data supplied from the I/O terminal is selected by the column decoder 2b to be loaded into the page buffer 3. The page buffer 3 is loaded with a one page portion of write data. Row and column address signals are inputted via the I/O buffer 9 and transferred to the row decoder 2a and column decoder 2b, respectively. The row address register 5a stores an erase block address in the case of erasing data, and stores a page address in the case of read and write of data. The column address register 5b is inputted with a leading column address for loading write data before start of a write operation, or a leading column address for a read operation. The column address register 5b stores the inputted column address until write enable /WE or read enable /RE is toggled by a certain condition.

The logic control circuit 6 controls input of a command or an address, and input/output of data, based on control signals such as a chip enable signal /CE, a command enable signal CLE, an address latch enable signal ALE, the write enable signal /WE, and the read enable signal /RE. The access operation is executed by a command. On receiving the command, the sequence control circuit 7 controls the access operation. The voltage generating circuit 8 is controlled by the sequence control circuit 7 to generate certain voltages required for various operations.

The controller 11 controls the access operation by conditions appropriate to a current write state of the NAND chip 10. Note that part of the access operation may also be controlled by the control unit of the NAND chip 10.

Next, the memory cell array 1 of the semiconductor memory device according to the present embodiment will be described.

Figure 2:
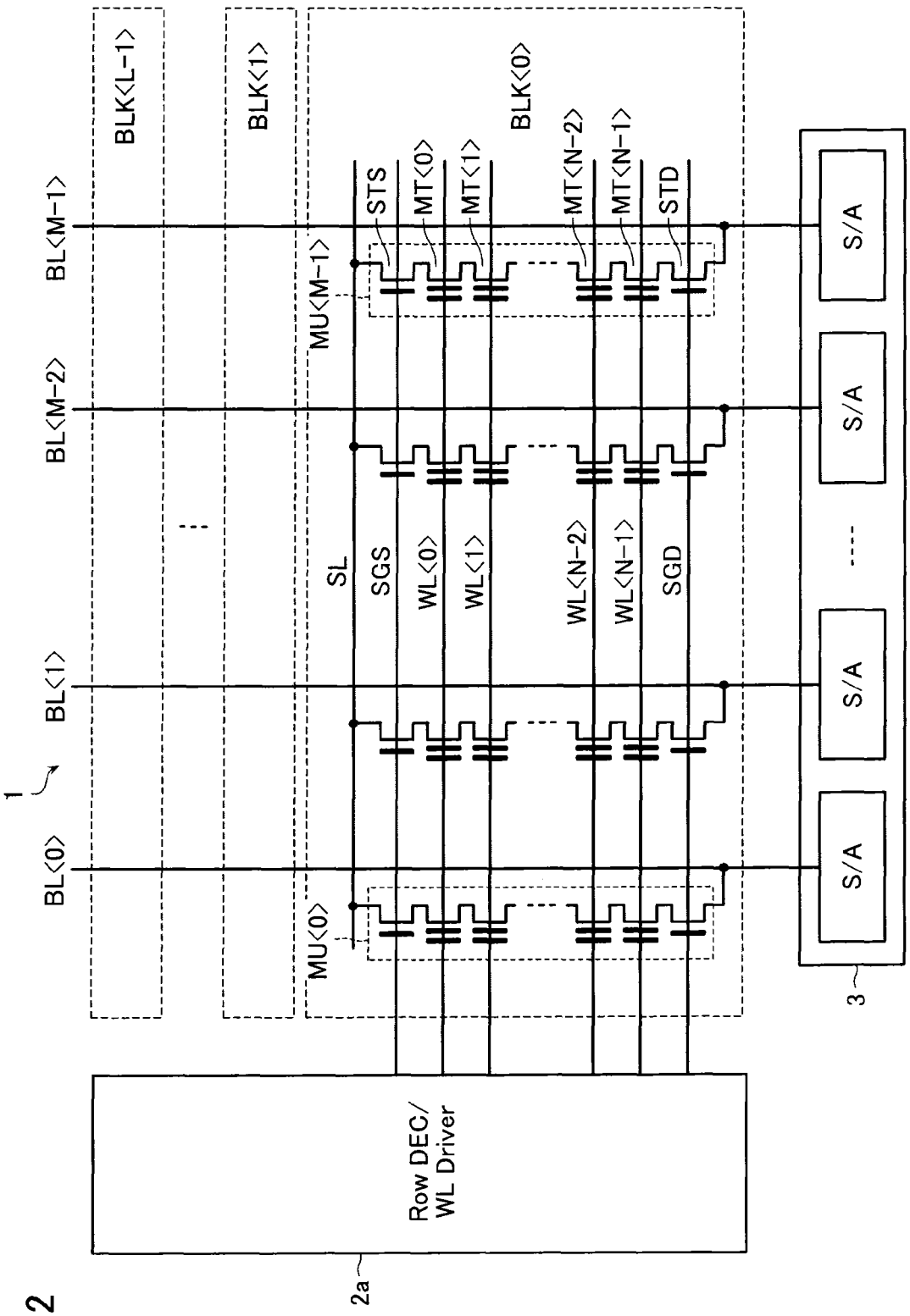
FIG. 2 is a circuit diagram of a memory cell array in the semiconductor memory device according to the same embodiment.

FIG. 2 is a circuit diagram of the memory cell array in the semiconductor memory device according to the present embodiment.

The memory cell array 1 includes: N word lines WL<0> to WL<N−1>, select gate lines SGS and SGD, and a source line SL that extend in the row direction; M bit lines BL<0> to BL<M−1> extending in the column direction; and M memory units MU<0> to MU<M−1>. Each of the memory units MU includes N memory transistors MT<0> to MT<N−1> (memory cells) connected in series, and select transistors STS and STD connected to both ends of these series-connected memory transistors MT. Each of the memory transistors MT has: a channel on a silicon substrate (semiconductor substrate); a floating gate (charge accumulation layer) formed above the channel; and a control gate formed above the floating gate.

A source of the source side select transistor STS is connected to the source line SL. A drain of the drain side select transistor STD is connected to one of the bit lines BL<0> to BL<M−1>. Control gates of the memory transistors MT<0> to MT<N−1> are connected to the word lines WL<0> to WL<N−1>. Control gates of the select transistors STS and STD are connected to the select gate lines SGS and SGD.

In the above-described configuration, the M memory units MU aligned in the row direction configure one block ELK. This block BLK is a unit of batch erase of data. The memory cell array 1 includes L blocks BLK<0> to BLK<L−1> aligned in the column direction.

The word line WL and the select gate lines SGS and SGD are driven by the row decoder 2a. Moreover, each of the bit lines BL is connected to a sense amplifier circuit S/A of the page buffer 3.

The memory cell array 1 of the present embodiment will be described below, but as a prerequisite of that description, next, a memory cell array 200 of a comparative example to the present embodiment will be described.

Figure 3:
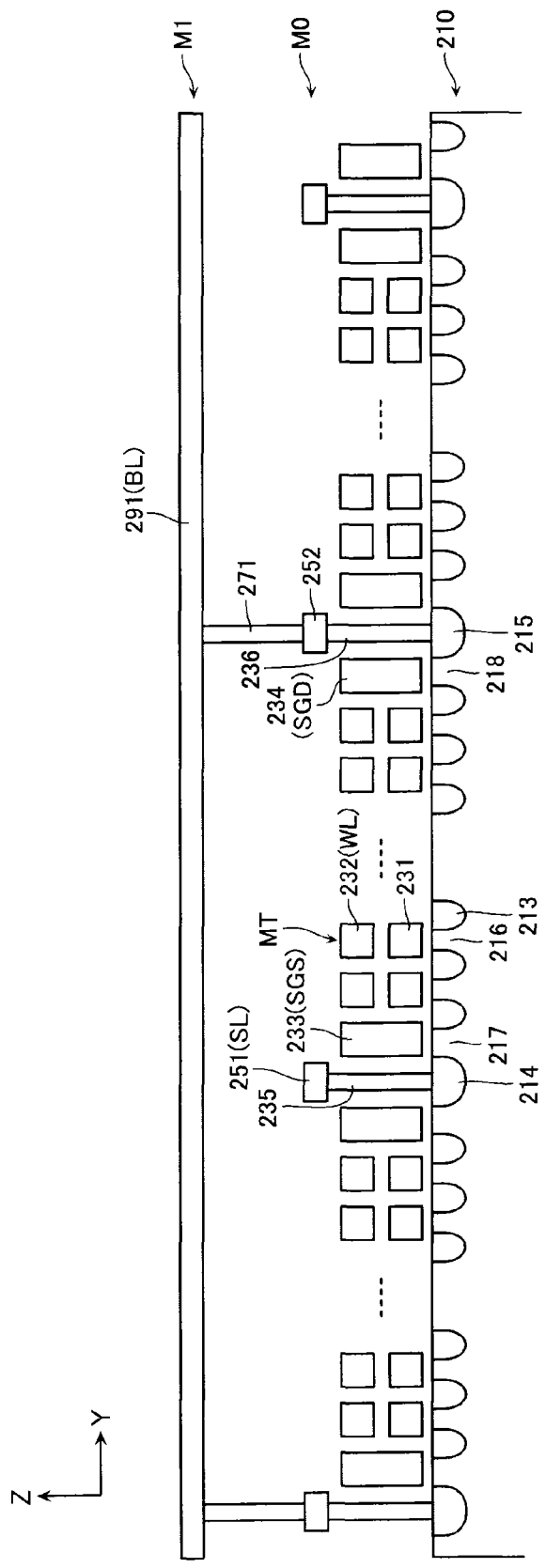
FIG. 3 is a cross-sectional view showing a structure of a memory cell array in a semiconductor memory device according to a comparative example to the same embodiment.
Figure 4:
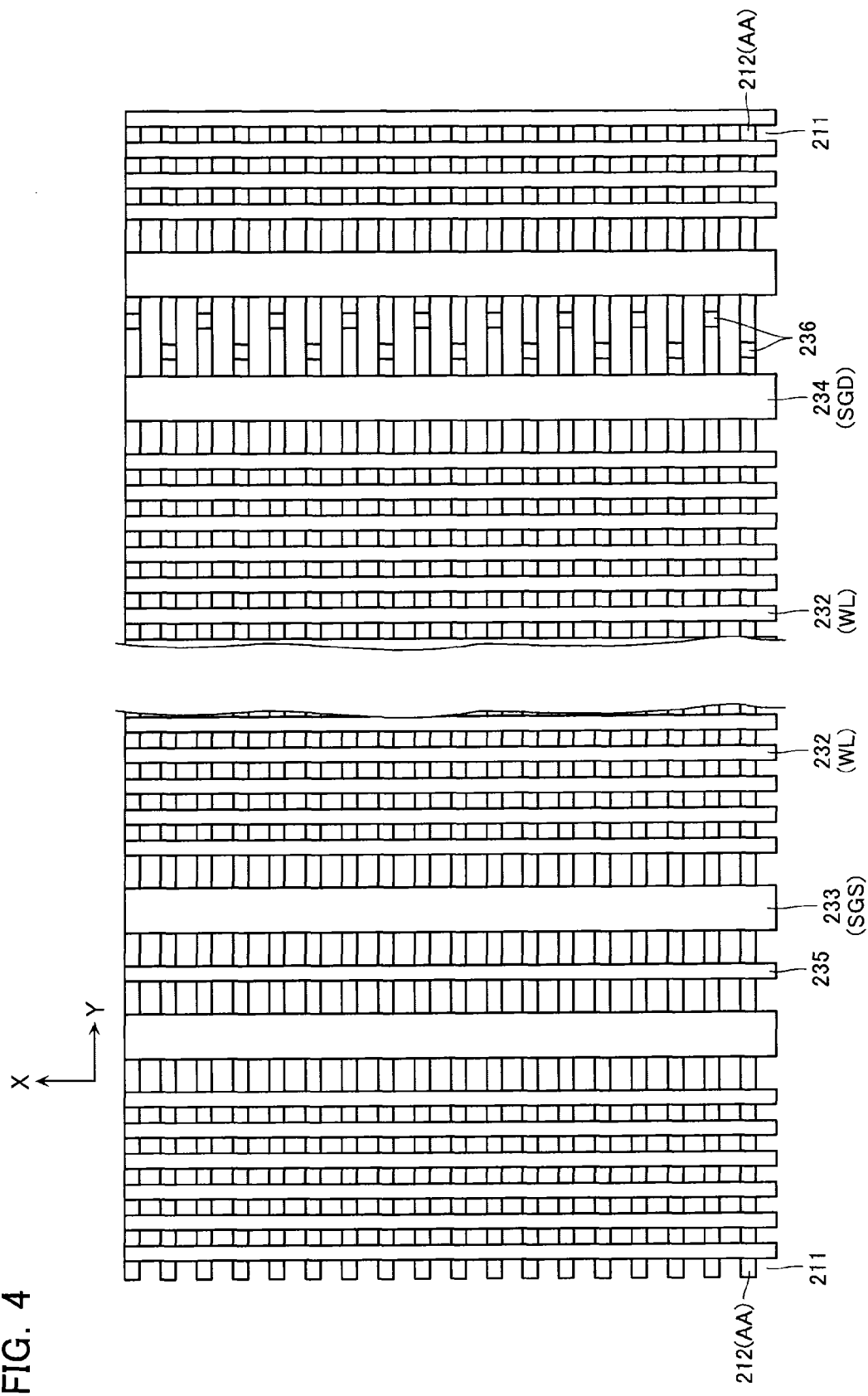
FIGS. 4 to 6 are plan views showing the structure of the memory cell array in the semiconductor memory device according to the same comparative example.
Figure 5:
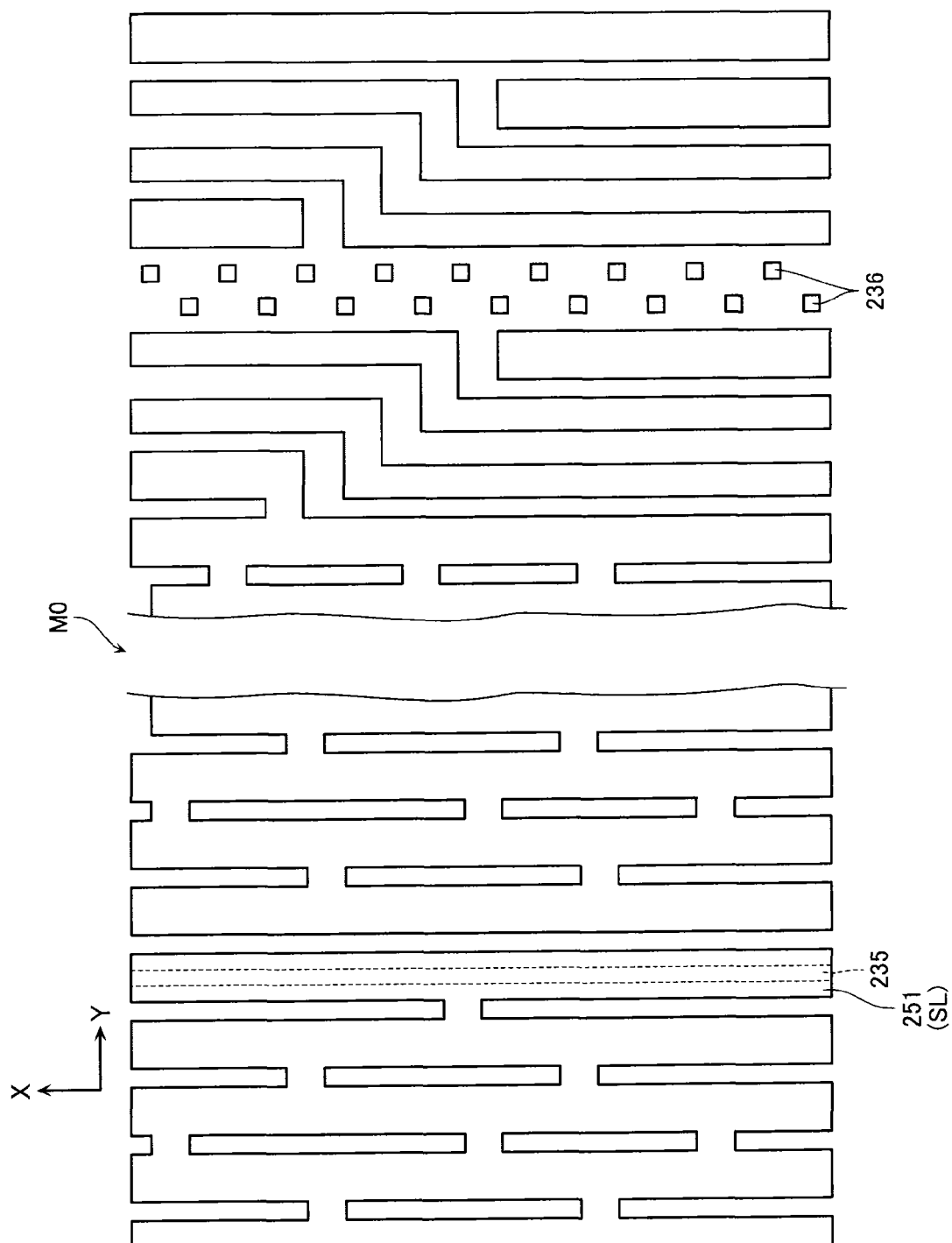
Figure 6:
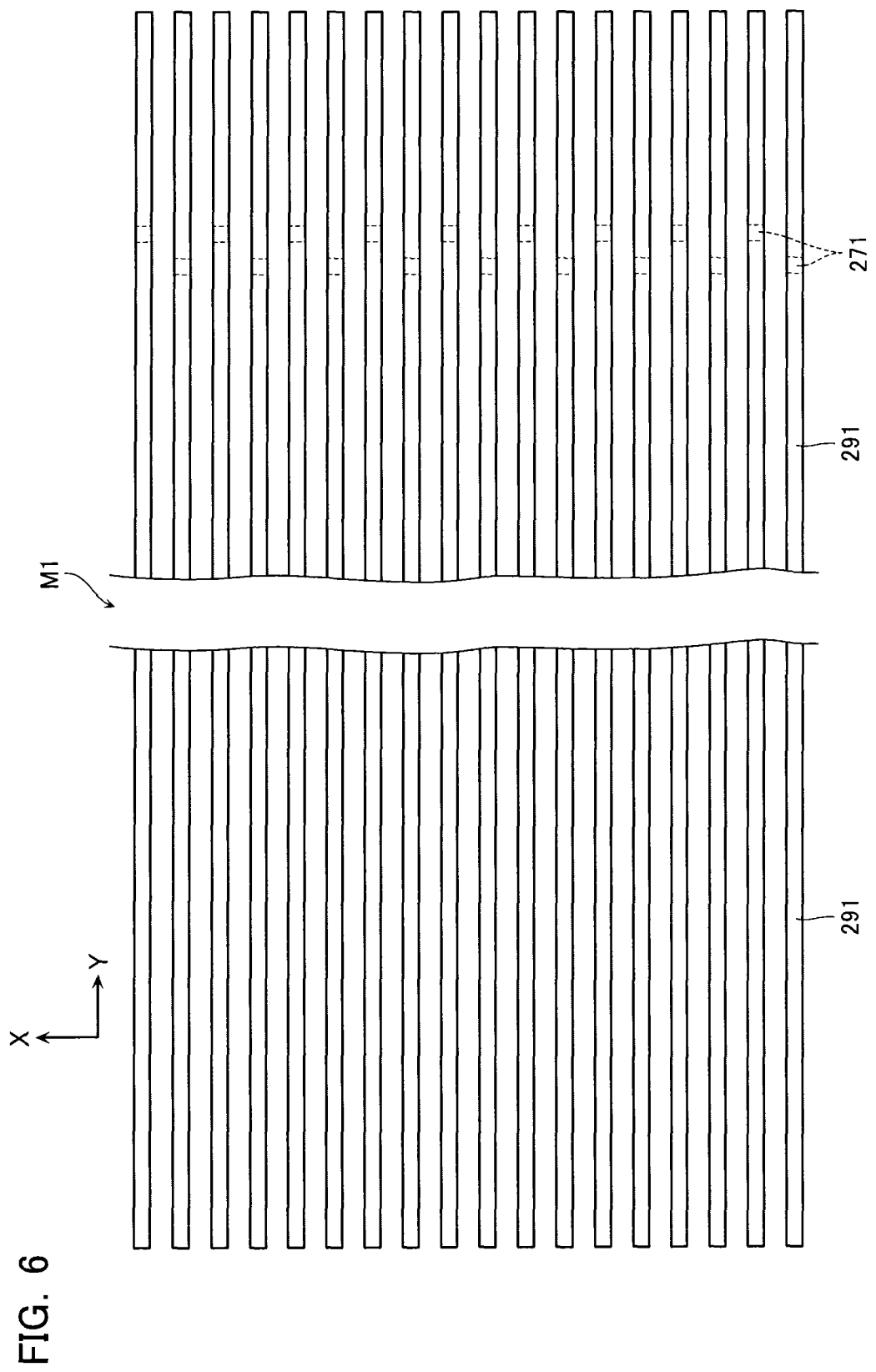

FIG. 3 is a cross-sectional view showing a structure of the memory cell array in a semiconductor memory device according to the comparative example to the present embodiment, and FIGS. 4 to 6 are plan views showing the structure of the same memory cell array.

As shown in FIGS. 4 to 6, the memory cell array 200 of the comparative example has a structure in which an intermediate wiring line layer M0 and an upper layer wiring line layer M1 are stacked in a Z direction above a silicon substrate 210.

As shown in FIGS. 3 and 4, formed in the silicon substrate 210 is an active area AA (212) divided by a trench 211 extending in a Y direction. Furthermore, formed above the active area AA are a plurality of diffusion layers 213 to 215 aligned in the Y direction.

As shown in FIGS. 3 and 4, disposed above the silicon substrate 210 at a position of a channel 216 between the diffusion layers 213 adjacent in the Y direction are a floating gate 231 (charge accumulation layer) of a memory transistor MT and a word line WL (232) that extends in an X direction.

The word line WL functions as a control gate of the memory transistor MT. Moreover, disposed above the silicon substrate 210 at a position of a channel 217 between the diffusion layers 213 and 214 adjacent in the Y direction is a source side select gate line SGS (233) extending in the X direction, and disposed above the silicon substrate 210 at a position of a channel 218 between the diffusion layers 213 and 215 adjacent in the Y direction is a drain side select gate line SGD (234) extending in the X direction. Furthermore, disposed above the silicon substrate 210 at a position of the diffusion layer 214 is an LI contact 235 reaching the intermediate wiring line layer M0, and disposed above the silicon substrate 210 at a position of the diffusion layer 215 is a CB contact 236 reaching the intermediate wiring line layer M0.

As shown in FIGS. 3 and 5, disposed in the intermediate wiring line layer M0 at a position of the diffusion layer 214 is a source line SL (251) extending in the X direction. The source line SL is electrically connected to the diffusion layer 214 via the LI contact 235. Moreover, disposed in the intermediate wiring line layer M0 at a position of the diffusion layer 215 is an intermediate electrode 252. The intermediate electrode 252 is electrically connected to the diffusion layer 215 via the CB contact 236.

As shown in FIGS. 3 and 6, disposed above the intermediate wiring line layer M0 at a position of the diffusion layer 215 is a via 271 reaching the upper layer wiring line layer M1.

As shown in FIGS. 3 and 6, disposed in the upper layer wiring line layer M1 at a position of the active area AA is a bit line BL (291) extending in the Y direction. The bit line BL contacts the via 271 at a bottom surface of the bit line BL. As a result, the bit line BL is electrically connected to the diffusion layer 215.

As described above, in the case of the memory cell array 200 of the comparative example, the intermediate wiring line layer M0 is employed in the source line SL on a source side. On the other hand, the upper layer wiring line layer M1 which is even more upward than the intermediate wiring line layer M0 is employed in the bit line BL on a drain side. The source line SL on the source side need only be set to 0 V during the read operation, hence does not need to be provided on a memory unit MU basis and may be shared by a plurality of memory units MU. On the other hand, the bit line BL on the drain side must be made electrically independent on a memory unit MU basis. Therefore, the bit line BL is required to be formed with the same width in the X direction as the diffusion layers 213 to 215.

In the case of a NAND type flash memory, along with miniaturization of the memory transistor MT, a pitch of the bit lines BL for passing a cell current narrows, and it becomes impossible to ignore wiring line resistance and inter-wiring line capacitance. Therefore, time taken for charging/discharging of the bit line BL during the access operation continues to increase. Wiring line resistance R of the bit line BL is proportional to wiring line length L and inversely proportional to cross-sectional area A ($R=\rho \cdot L/A$), hence when cross-sectional area A becomes small due to miniaturization, the wiring line resistance R increases. Inter-wiring line capacitance C between the bit lines BL is proportional to cross-sectional area A and inversely proportional to a distance d between the bit lines BL. Therefore, the inter-wiring line capacitance C not only increases by the distance d being narrowed for miniaturization, but also, conversely to the wiring line resistance R, ends up increasing even if cross-sectional area A is increased. As a result, if the bit line BL has been formed in only one planar wiring line layer (upper layer wiring line layer M1 in FIG. 3) as in the memory cell array 200 of the comparative example, it becomes a problem that RC delay is large.

Furthermore, along with miniaturization of the memory transistor MT, fellow bit lines BL become close to each other, hence there also occurs a problem of cross-talk where an effect is exerted as noise by cell currents flowing in adjacent bit lines BL. There are mainly two read systems of a NAND type flash memory, namely, a voltage sensing system and a current sensing system. In the case of the voltage sensing system, in order to suppress misreading due to amplitude of voltage of the bit line BL, every other bit line BL is set to a ground voltage, and the remaining bit lines BL are employed to read the data. In other words, the bit lines BL aligned in odd-numbered positions and the bit lines BL aligned in even-numbered positions are alternately employed to advance the read of data. In this case, although the effect of amplitude of voltage of the bit line BL is suppressed by a shielding effect of the bit lines BL at ground potential, operation speed ends up falling because only half of the bit lines BL at a time can read the data. On the other hand, in the case of the current sensing system, all of the bit lines BL can be employed to read all of the data in a batch, hence operation speed is good. However, since a cell current must be constantly passed in a sensing operation, power consumption ends up increasing.

Accordingly, in view of the above-described situation occurring in the case of the comparative example, the present embodiment employs a memory cell array 1 of the following structure.

Figure 7:
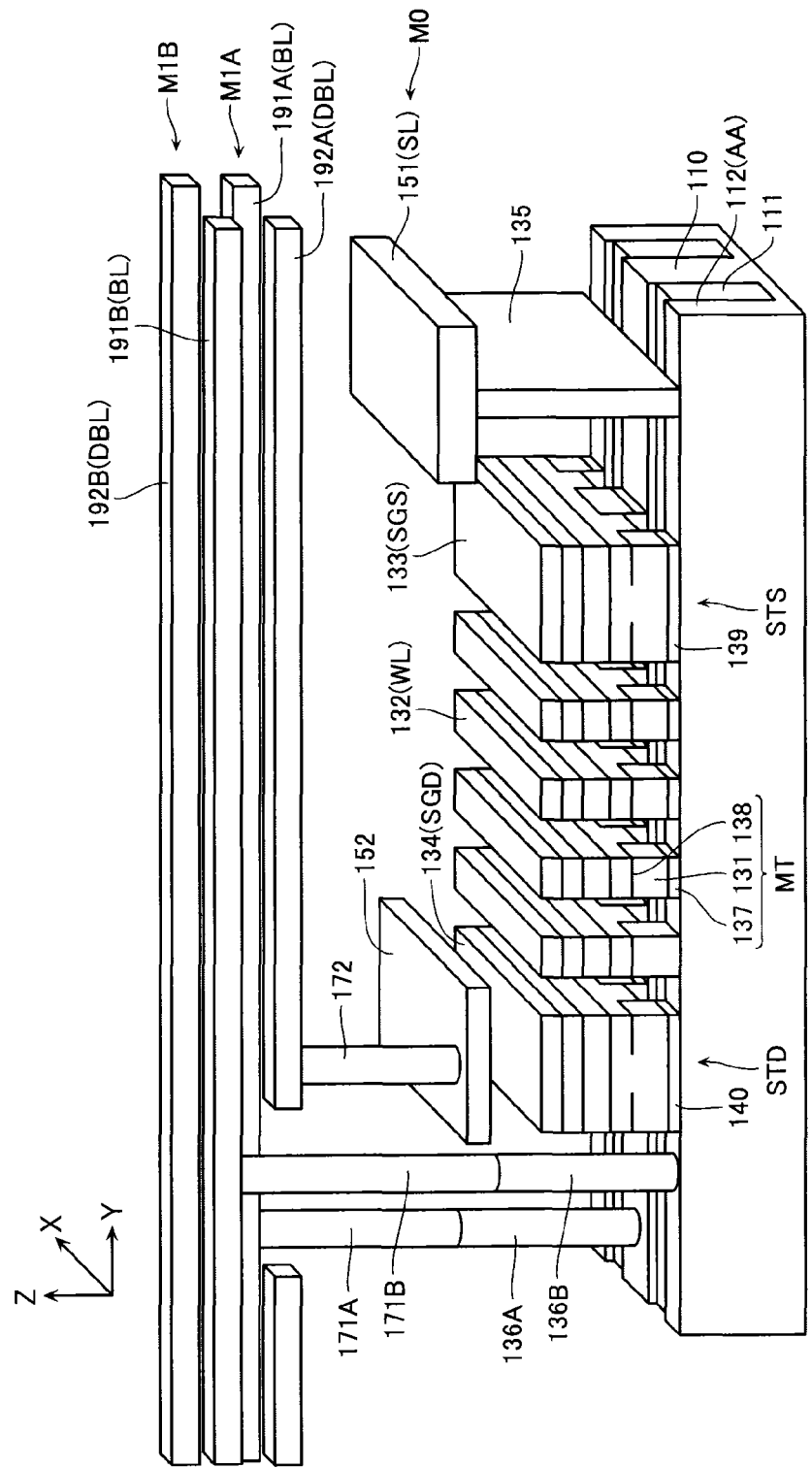
FIG. 7 is a perspective view showing a structure of the memory cell array in the semiconductor memory device according to the same embodiment.

FIG. 7 is a perspective view showing the structure of the memory cell array in the semiconductor memory device according to the present embodiment, and FIGS. 8 to 11 are plan views showing the structure of the same memory cell array.

As shown in FIGS. 8 to 11, the memory cell array 1 of the embodiment has a structure in which an intermediate wiring line layer M0 and two upper layer wiring line layers M1A (first wiring line layer) and M1B (second wiring line layer) are stacked in a Z direction (third direction) above a silicon substrate 110.

Figure 8:
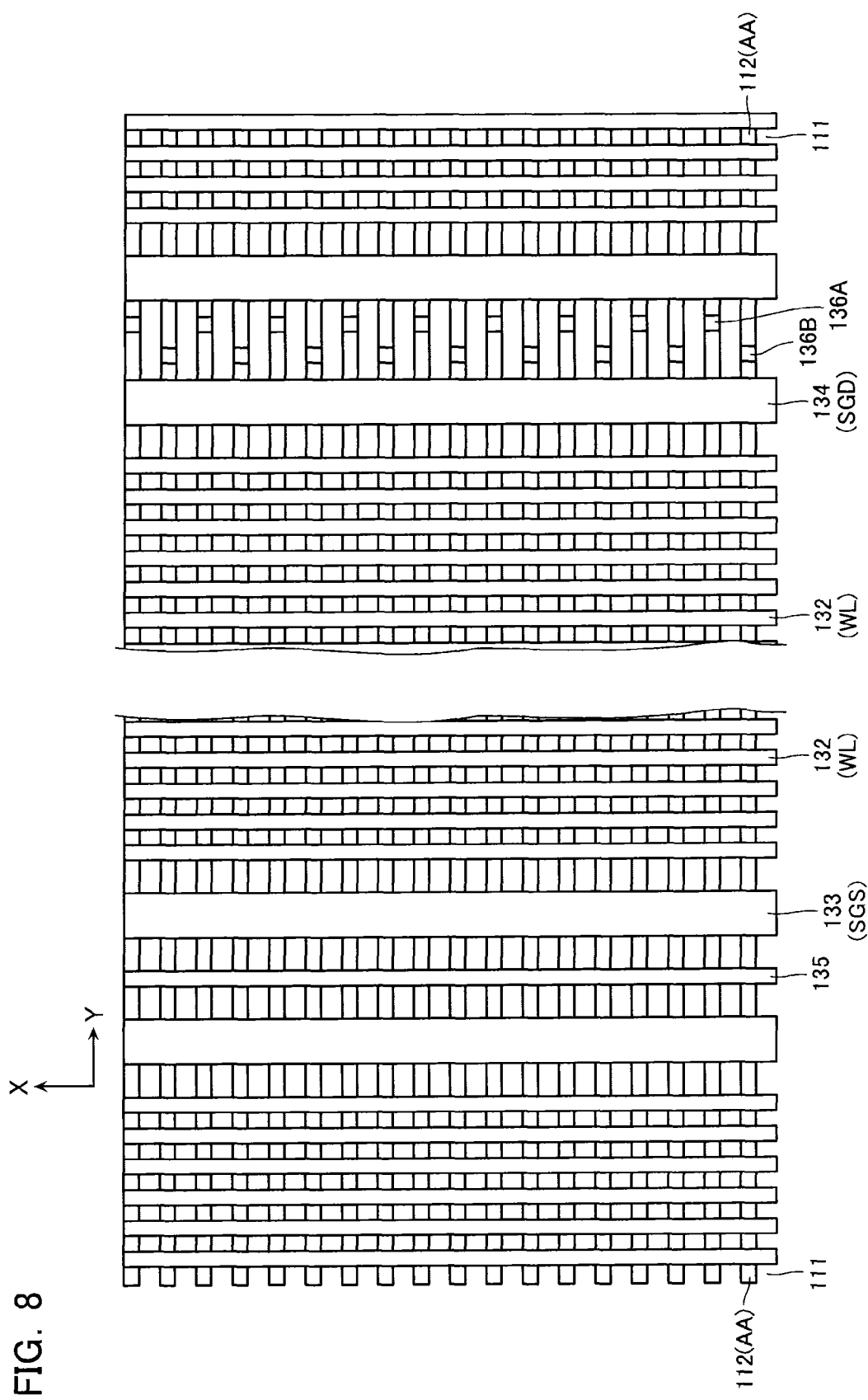
FIGS. 8 to 11 are plan views showing the structure of the memory cell array in the semiconductor memory device according to the same embodiment.

As shown in FIGS. 7 and 8, formed in the silicon substrate 110 is an active area AA (112) divided by a trench 111 extending in a Y direction (second direction). Furthermore, formed above the active area AA are diffusion layers 113 to 115 (corresponding to 213 to 215 in FIG. 3; not illustrated) aligned in the Y direction.

As shown in FIGS. 7 and 8, disposed above the silicon substrate 110 at a position of a channel 116 (corresponding to 216 in FIG. 3; not illustrated) between the diffusion layers 113 adjacent in the Y direction are: a tunnel insulating film 137, a floating gate 131 (charge accumulation layer), and a block insulating film 138 of a memory transistor MT; and a multi-layer structured word line WL (132) that extends in an X direction (first direction) and functions as a control gate of the memory transistor MT. Disposed above the silicon substrate 110 at a position of a channel 117 (corresponding to 217 in FIG. 3; not illustrated) between the diffusion layers 113 and 114 adjacent in the Y direction are: an insulating film 139 of the source side select transistor STS; and a multi-layer structured source side select gate line SGS (133) extending in the X direction and functioning as a control gate of the source side select transistor STS. Disposed above the silicon substrate 110 at a position of a channel 118 (corresponding to 218 in FIG. 3; not illustrated) between the diffusion layers 113 and 115 adjacent in the Y direction are: an insulating film 140 of the drain side select transistor STD; and a multi-layer structured drain side select gate line SGD (134) extending in the X direction and functioning as a control gate of the drain side select transistor STD. Furthermore, disposed above the silicon substrate 110 at a position of the diffusion layer 114 is an LI contact 135 that reaches the intermediate wiring line layer M0, and disposed above the silicon substrate 110 at a position of the diffusion layer 115 are CB contacts 136A and 136B that reach the intermediate wiring line layer M0.

Figure 9:
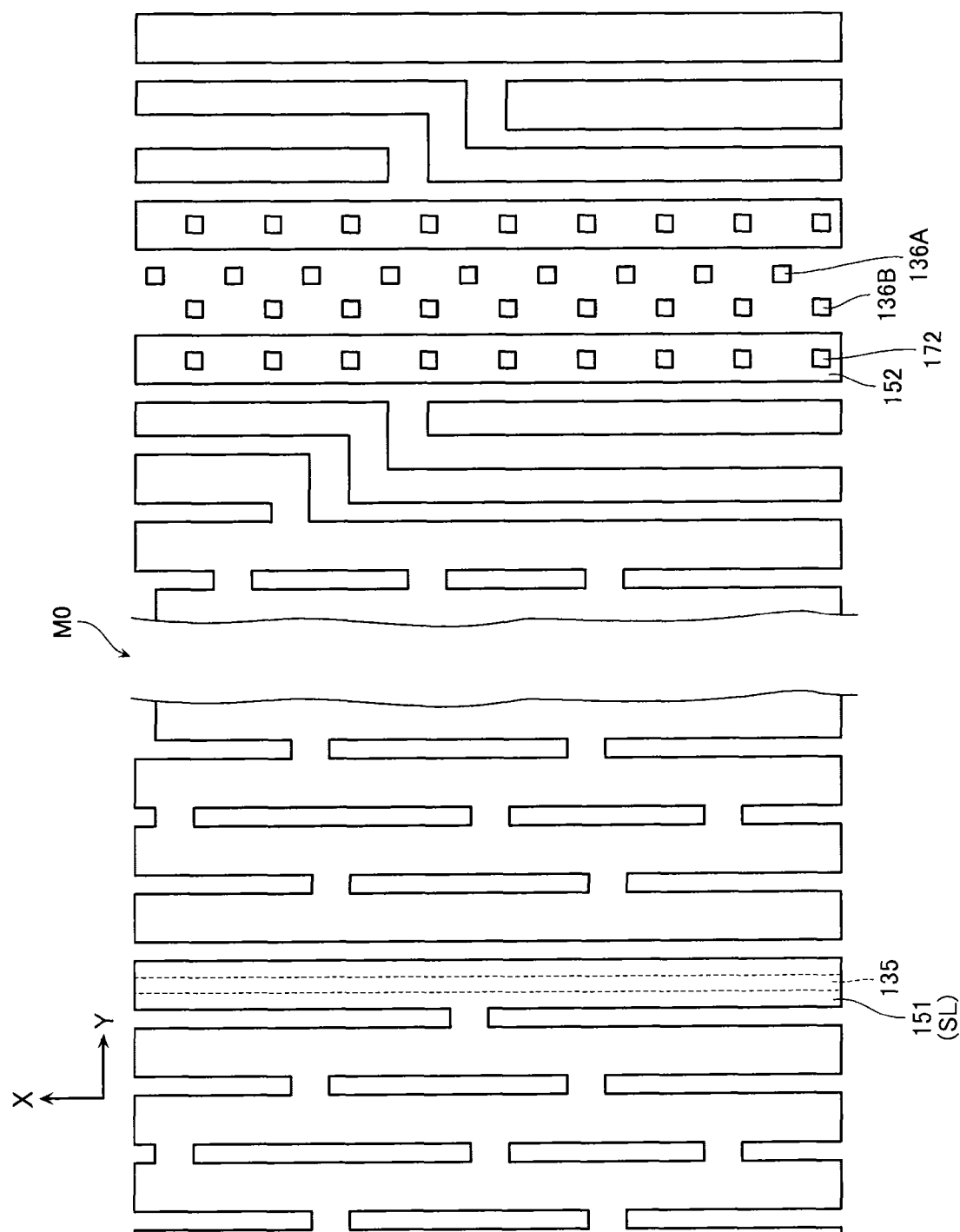

As shown in FIGS. 7 and 9, disposed in the intermediate wiring line layer M0 at a position of the diffusion layer 114 is a source line SL (151) extending in the X direction. The source line SL is electrically connected to the diffusion layer 114 via the LI contact 135. Moreover, disposed in the intermediate wiring line layer M0 at a position not obstructing positions of the LI contact 135 and the CB contacts 136A and 136B, for example, at a position of the drain side select transistor STD, is an intermediate electrode 152. The intermediate electrode 152 is set to a ground voltage during the access operation.

Figure 10:
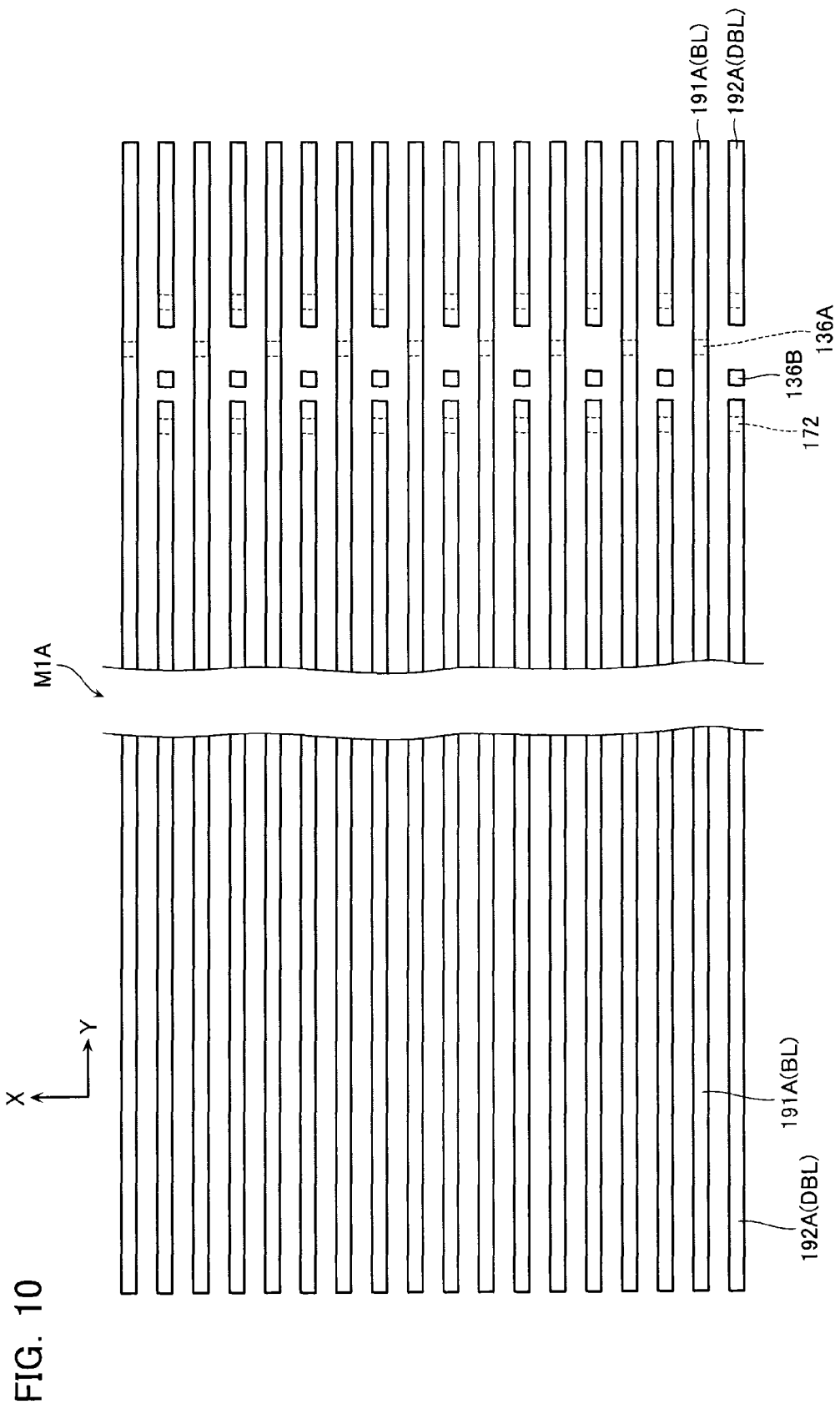

As shown in FIGS. 7 and 10, disposed above the intermediate wiring line layer M0 at a position of the diffusion layer 115 are a via 171A reaching the upper layer wiring line layer M1A and a via 171B reaching the upper layer wiring line layer M1B. The via 171A contacts an upper surface of the CB contact 136A at a bottom surface of the via 171A, and the via 171B contacts an upper surface of the CB contact 136B at a bottom surface of the via 171B. Moreover, disposed above the intermediate wiring line layer M0 at a position of the intermediate electrode 152 is a via 172 reaching the upper layer wiring line layer M1A. The via 172 contacts an upper surface of the intermediate electrode 152 at a bottom surface of the via 172.

Figure 11:
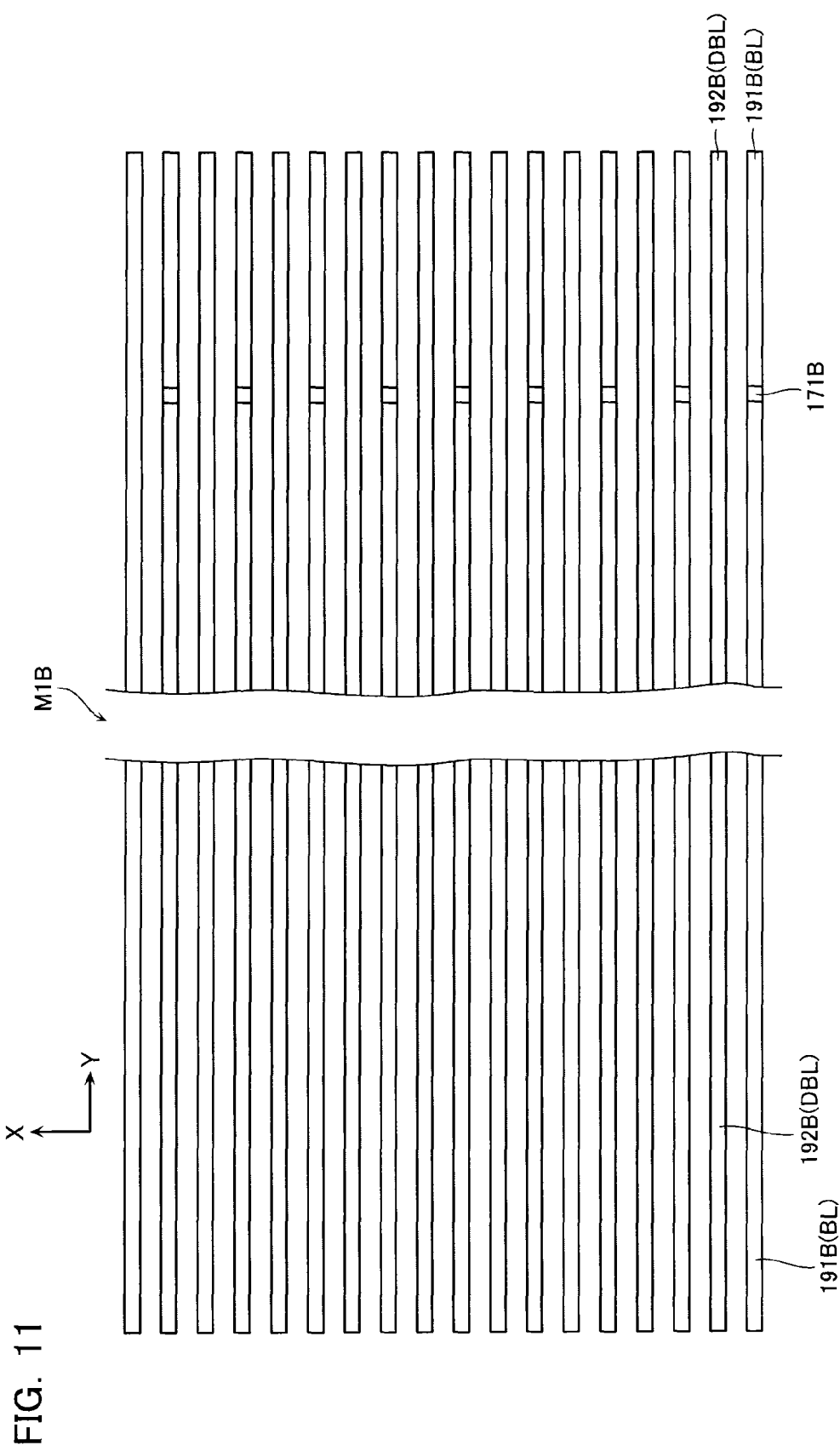

As shown in FIGS. 7 and 11, disposed in the upper layer wiring line layer M1A at a position of the active area AA are: a bit line BL (191A); and a dummy bit line DBL (192A) having substantively the same structure as the bit line BL (191A), that extend in the Y direction. The bit line BL (191A) and the dummy bit line DBL (192A) are disposed alternately one at a time with the same pitch and line width, in the X direction. The bit line BL (191A) contacts the via 171A, and is thereby electrically connected to the diffusion layer 115. Moreover, the dummy bit line DBL (192A) contacts the via 172, and is thereby electrically connected to the intermediate electrode 152.

Figure 12:
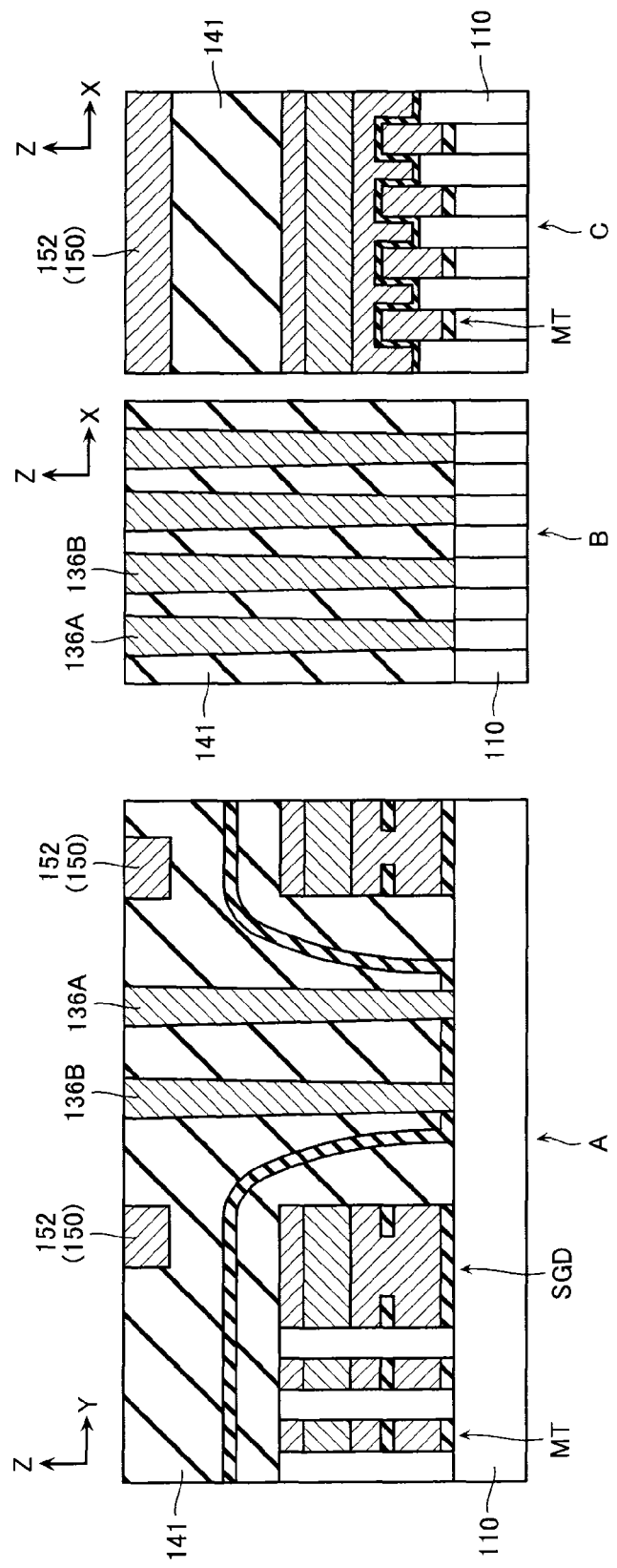
FIGS. 12 to 21 are cross-sectional views explaining production steps of the memory cell array in the semiconductor memory device according to the same embodiment.

As shown in FIGS. 7 and 12, disposed in the upper layer wiring line layer M1B at a position of the active area AA are: a bit line BL (191B); and a dummy bit line DBL (192B) having substantively the same structure as the bit line BL (191B), that extend in the Y direction. The bit line BL (191B) and the dummy bit line DBL (192B) are disposed alternately one at a time with the same pitch and line width, in the X direction. The bit line BL (191B) is disposed at a position of the dummy bit line DBL (192A) of the upper layer wiring line layer M1A, and the dummy bit line DBL (192B) is disposed at a position of the bit line BL (191A) of the upper layer wiring line layer M1A. In other words, when the memory cell array 1 is viewed from the Z direction, the bit lines BL (191A and 191B) appear disposed one each in the same positions in the X direction and the Y direction. Moreover, when the memory cell array 1 is viewed from the Y direction, the bit lines BL (191A and 191B) appear disposed staggered with a reverse phase of the dummy bit lines DBL (192A and 192B). The bit line BL (191B) contacts the via 171B, and is thereby electrically connected to the diffusion layer 115. Moreover, the dummy bit line DBL (192B) is electrically connected to, for example, a certain electrode not illustrated disposed above the upper layer wiring line layer M1B and in which a ground potential is set during the access operation.

As described above, in the present embodiment, the bit lines BL are disposed alternately in the two upper layer wiring line layers M1A and M1B, and the dummy bit lines DBL set to a ground potential during the access operation are disposed at positions close to the bit lines BL in the X direction and the Z direction. In this case, it is difficult for the dummy bit line DBL (192A) of the upper layer wiring line layer M1A to be connected to an electrode positioned more upwardly than the upper layer wiring line layer M1B. Therefore, in the present embodiment, as previously mentioned, the dummy bit line DBL (192A) is electrically connected to the intermediate electrode 152 of the intermediate wiring line layer M0, thereby enabling setting of a ground potential. Moreover, since the dummy bit line DBL (192A) of the upper layer wiring line layer M1A is disposed at a position of the bit line BL (191B) of the upper layer wiring line layer M1B, a contrivance is required to electrically connect the bit line BL (191B) to the diffusion layer 115. In this regard, in the present embodiment, the dummy bit line DBL (192A) is divided in a disposition region of the via 171B, whereby interference between the via 171B and the dummy bit line DBL (192A) is avoided.

As described above, in the present embodiment, the dummy bit lines DBL acting as a shield during the access operation are disposed between the bit lines BL adjacent in the X direction. Therefore, the present embodiment makes it possible for the effect received from the adjacent bit lines BL to be reduced more than in the comparative example, even when the read operation is performed in a batch employing all of the bit lines BL. Furthermore, in the present embodiment, the bit lines BL are distributed between the two upper layer wiring line layers M1A and M1B, whereby relative positions of the adjacent bit lines BL are made more distant not only in the X direction but also in the Z direction. Therefore, the present embodiment makes it possible for capacitance between the adjacent bit lines BL to be made smaller and therefore makes it possible for charging/discharging of the bit lines BL during the access operation to be speeded up more than in the comparative example. In other words, the present embodiment makes it possible to provide a semiconductor memory device capable of a faster and more highly reliable access operation than the comparative example.

[Method of Producing Semiconductor Memory Device According to Embodiment]

Next, a method of producing the memory cell array in the semiconductor memory device according to the present embodiment will be described.

FIGS. 12 to 21 are cross-sectional views explaining production steps of the memory cell array in the semiconductor memory device according to the present embodiment. A in each of the drawings is a cross-sectional view cut in the Y direction. Moreover, B in each of the drawings is a cross-sectional view cut in the X direction at positions of the CB contacts 136A and 136B, and C in each of the drawings is a cross-sectional view cut in the X direction at a position of the memory transistor MT. It should be noted that in A and B of each of the drawings, the CB contacts 136A, and 136B, and the vias 171A, 171B, and 171B' are displayed at the same positions in the X direction and the Y direction, but in fact are disposed at different positions in the X direction and the Y direction.

First, as shown in FIG. 12, the memory transistor MT and the select transistors STS and STD are formed above the silicon substrate 110, and then an inter-layer insulating layer 141 and an intermediate conductive layer 150 that will be the intermediate wiring line layer M0 are stacked above the memory transistor MT and the select transistors STS and STD. The intermediate electrode 152 is formed in the intermediate conductive layer 150 at a position of the drain side select transistor STD. Moreover, the columnar CB contacts 136A and 136B penetrating the inter-layer insulating layer 141 are formed between the drain side select transistors STD adjacent in the Y direction.

Figure 13:
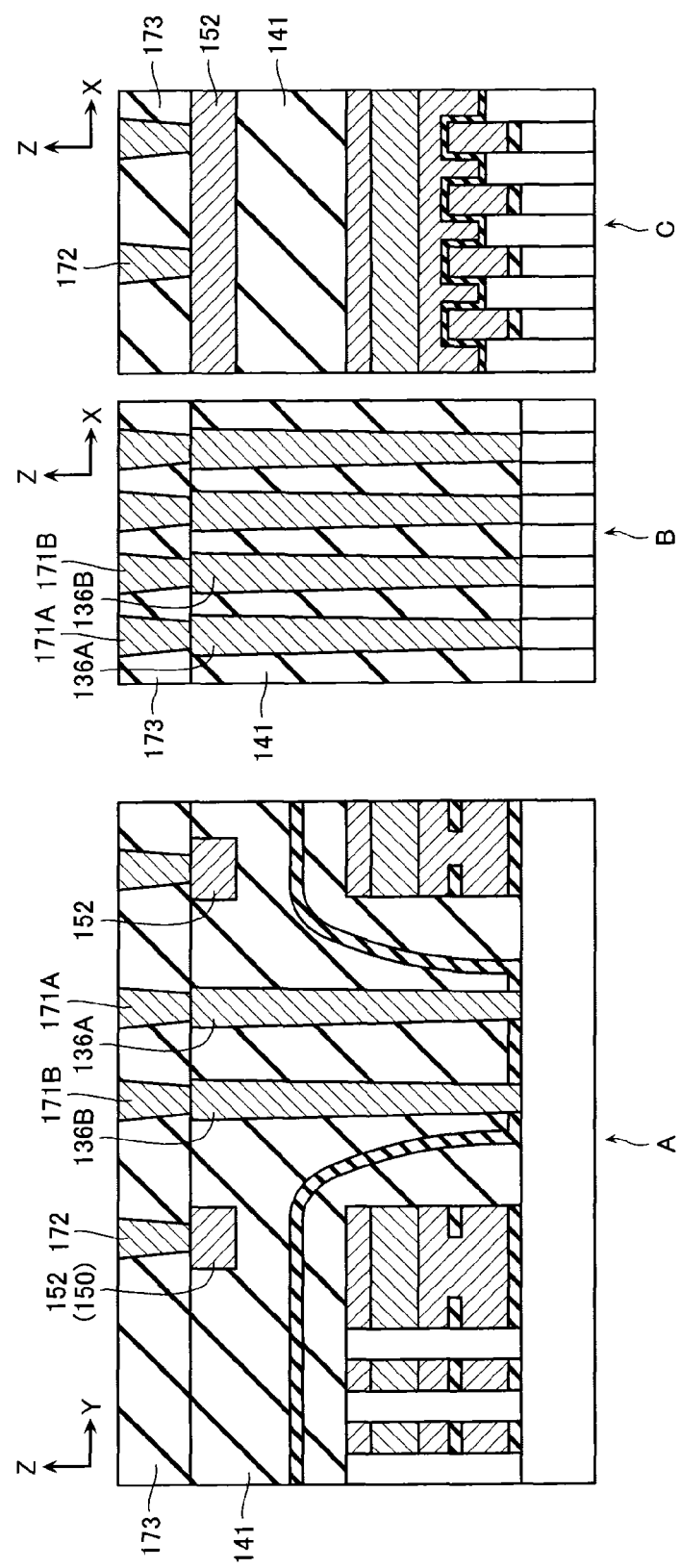

Next, as shown in FIG. 13, an inter-layer insulating layer 173 is stacked above the inter-layer insulating layer 141, the intermediate electrode 152, and the CB contacts 136A and 136B. Then, the vias 171A and 171B penetrating the inter-layer insulating layer 173 to reach the upper surfaces of the CB contacts 136A and 136B, are formed at positions of the CB contacts 136A and 136B. Moreover, the columnar via 172 penetrating the inter-layer insulating layer 173 to reach the intermediate electrode 152, is formed at a position of the intermediate electrode 152.

Figure 14:
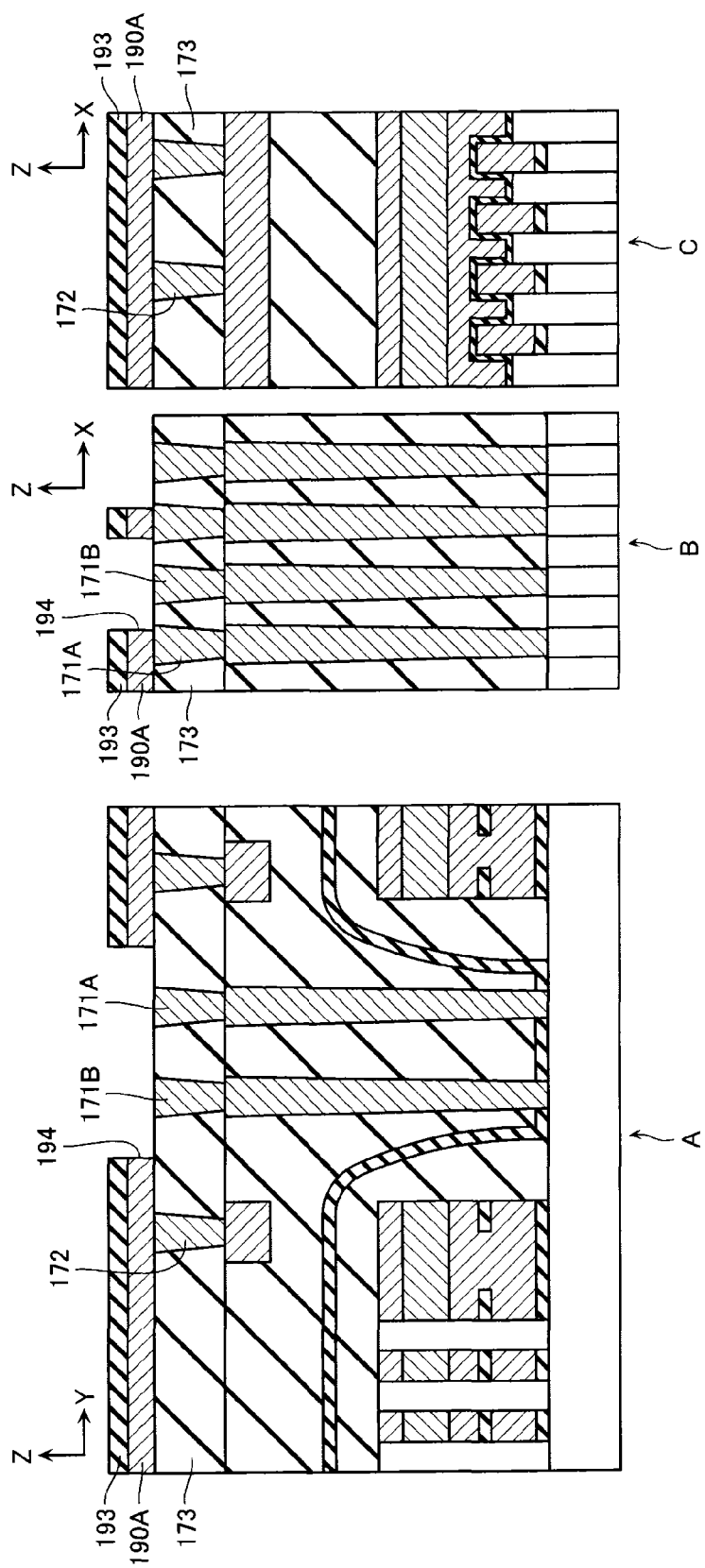

Next, as shown in FIG. 14, an upper layer conductive layer 190A which will be the upper layer wiring line layer M1A, and an inter-layer insulating layer 193, are stacked above the vias 171A, 171B, and 172, and the inter-layer insulating layer 173. The upper layer conductive layer 190A may be formed adopting, for example, tungsten (W) as its material. The inter-layer insulating layer 193 may be formed adopting, for example, silicon oxide (SiO$_2$) as its material. Then, anisotropic etching such as RIE is employed to remove a portion of the disposition region of the via 171B, of the upper layer conductive layer 190A and the inter-layer insulating layer 193. Hereafter, the removed portion is assumed to be a division place 194.

Figure 15:
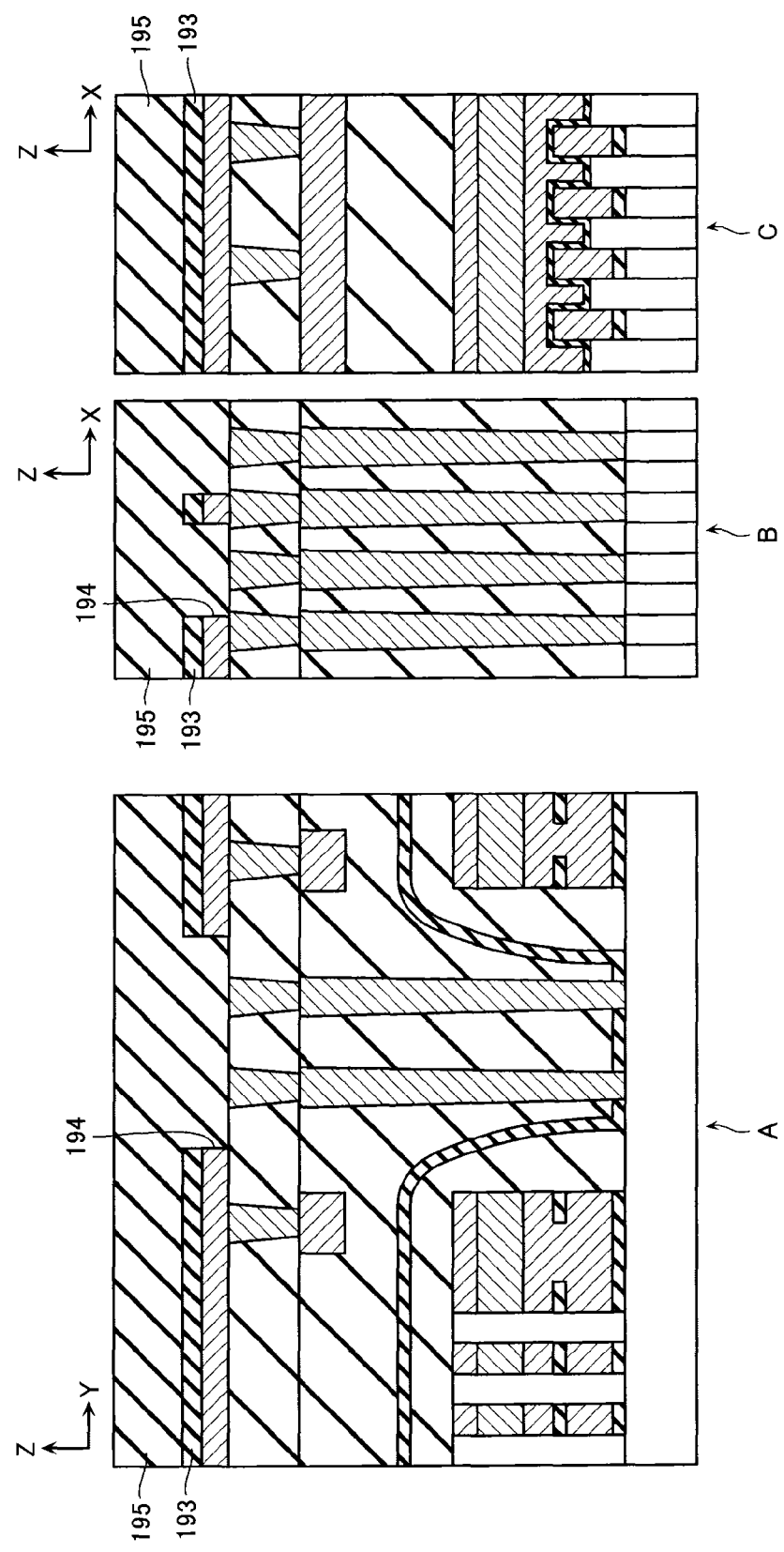

Next, as shown in FIG. 15, an inter-layer insulating layer 195 is stacked above the inter-layer insulating layer 193. As a result, the division place 194 is filled by the inter-layer insulating layer 195.

Figure 16:
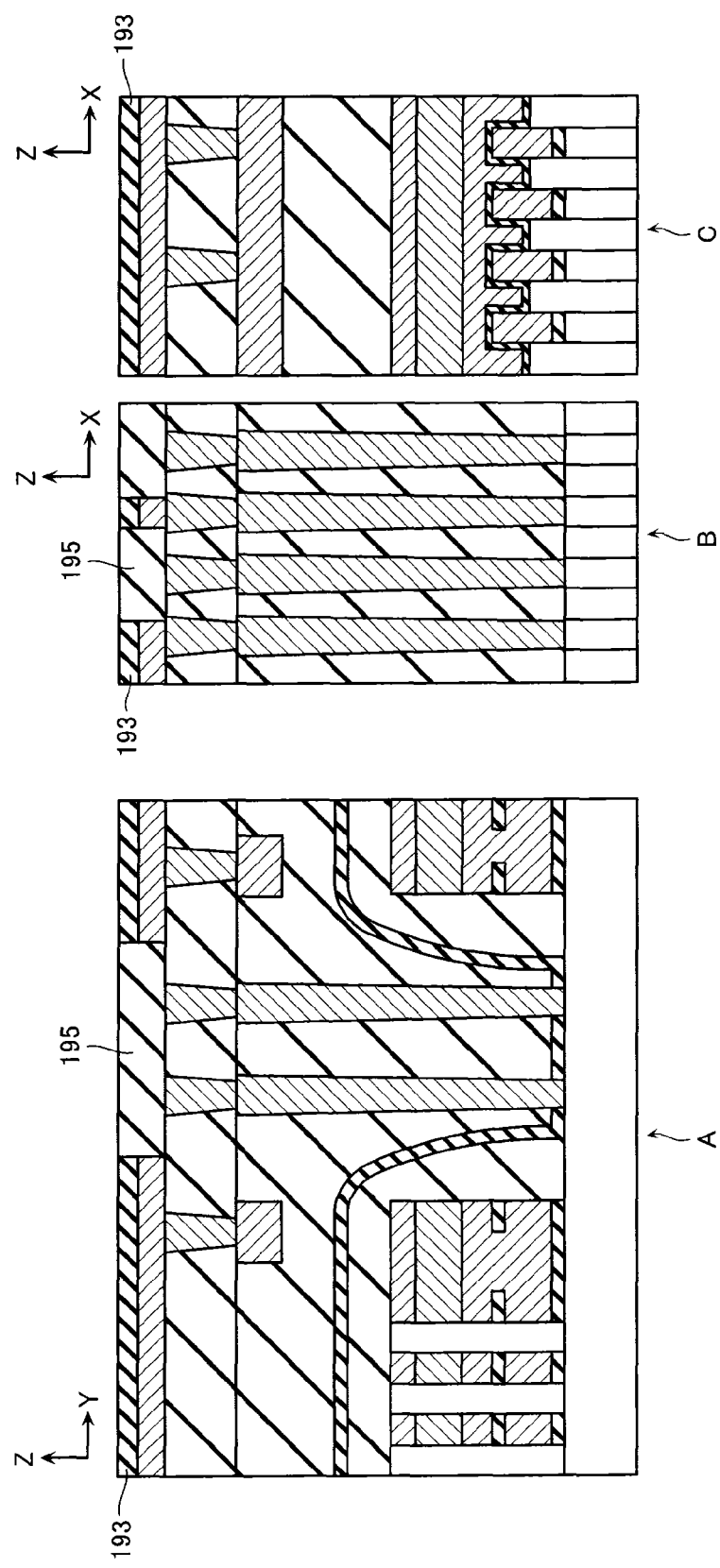

Next, as shown in FIG. 16, CMP is employed to remove an upper portion of the inter-layer insulating layer 195 to a degree that an upper surface of the inter-layer insulating layer 193 is visible, and to smooth an upper surface.

Figure 17:
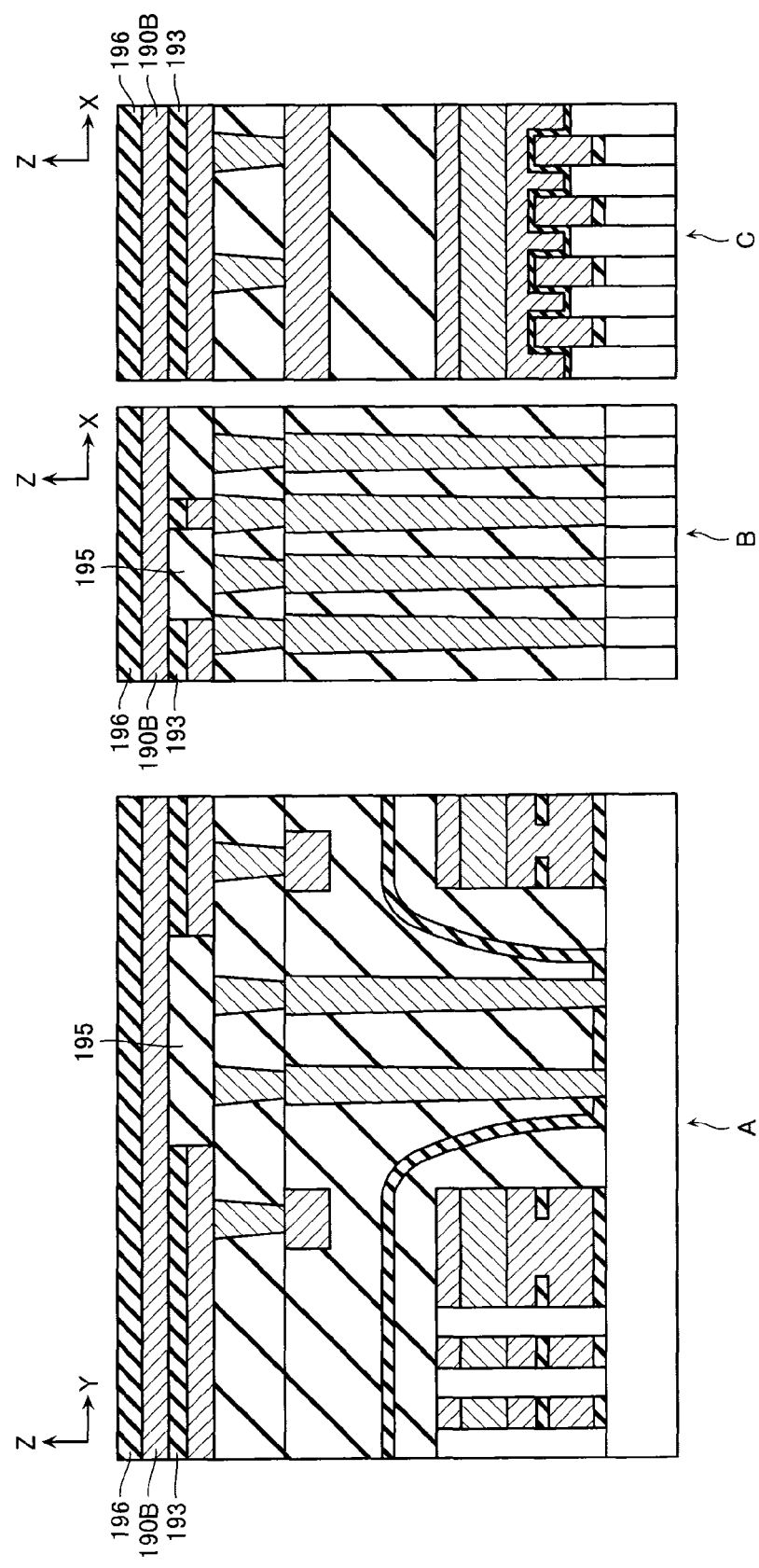

Next, as shown in FIG. 17, an upper layer conductive layer 190B which will be the upper layer wiring line layer M1B, and an inter-layer insulating film 196, are stacked above the inter-layer insulating layers 193 and 195. The upper layer conductive layer 190B may be formed adopting, for example, tungsten (W) as its material. The inter-layer insulating layer 196 may be formed adopting, for example, silicon oxide (SiO$_2$) as its material.

Figure 18:
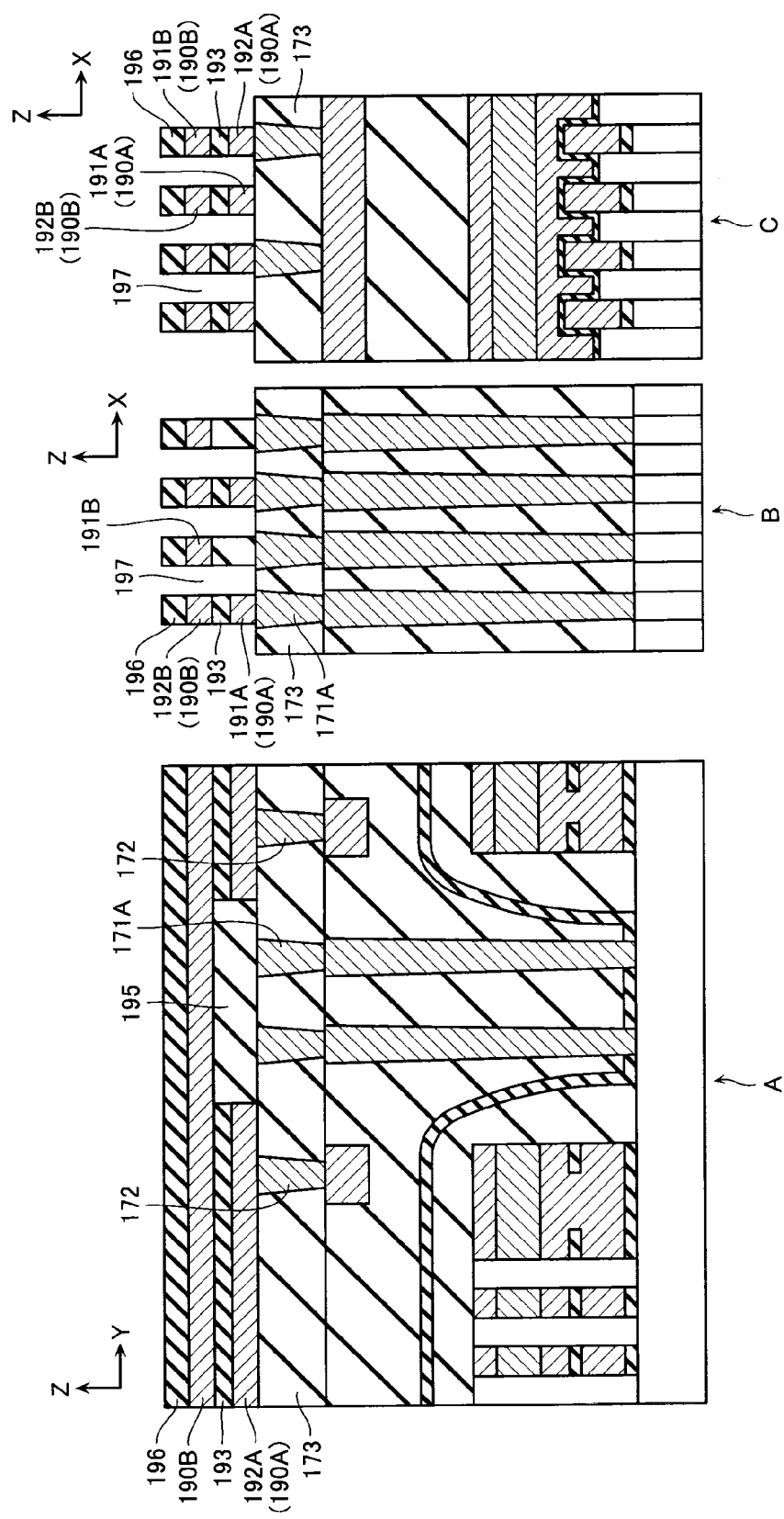

Next, as shown in FIG. 18, anisotropic etching such as RIE is employed to form in the upper layer conductive layers 190A and 190B, and the inter-layer insulating layers 193, 195, and 196 a plurality of trenches 197 extending in the Y direction and whose bottom surfaces reach an upper surface of the inter-layer insulating layer 173. As a result, the bit line BL (191A) contacting the via 171A, the dummy bit line DBL (192A) contacting the via 172, and the dummy bit line DBL (192B), are formed.

Figure 19:
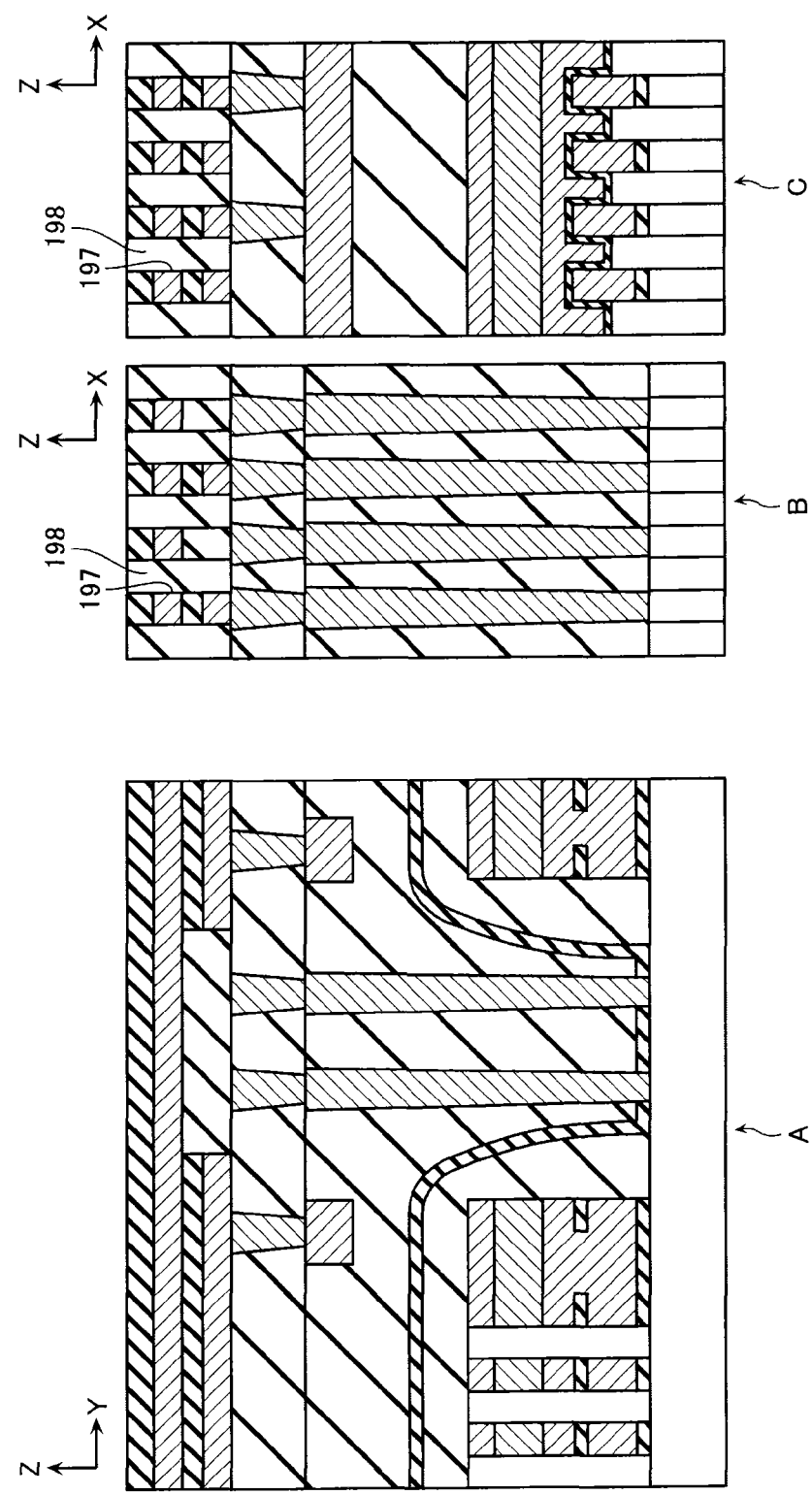

Next, as shown in FIG. 19, an inter-layer insulating film 198 is filled into the plurality of trenches 197.

Figure 20:
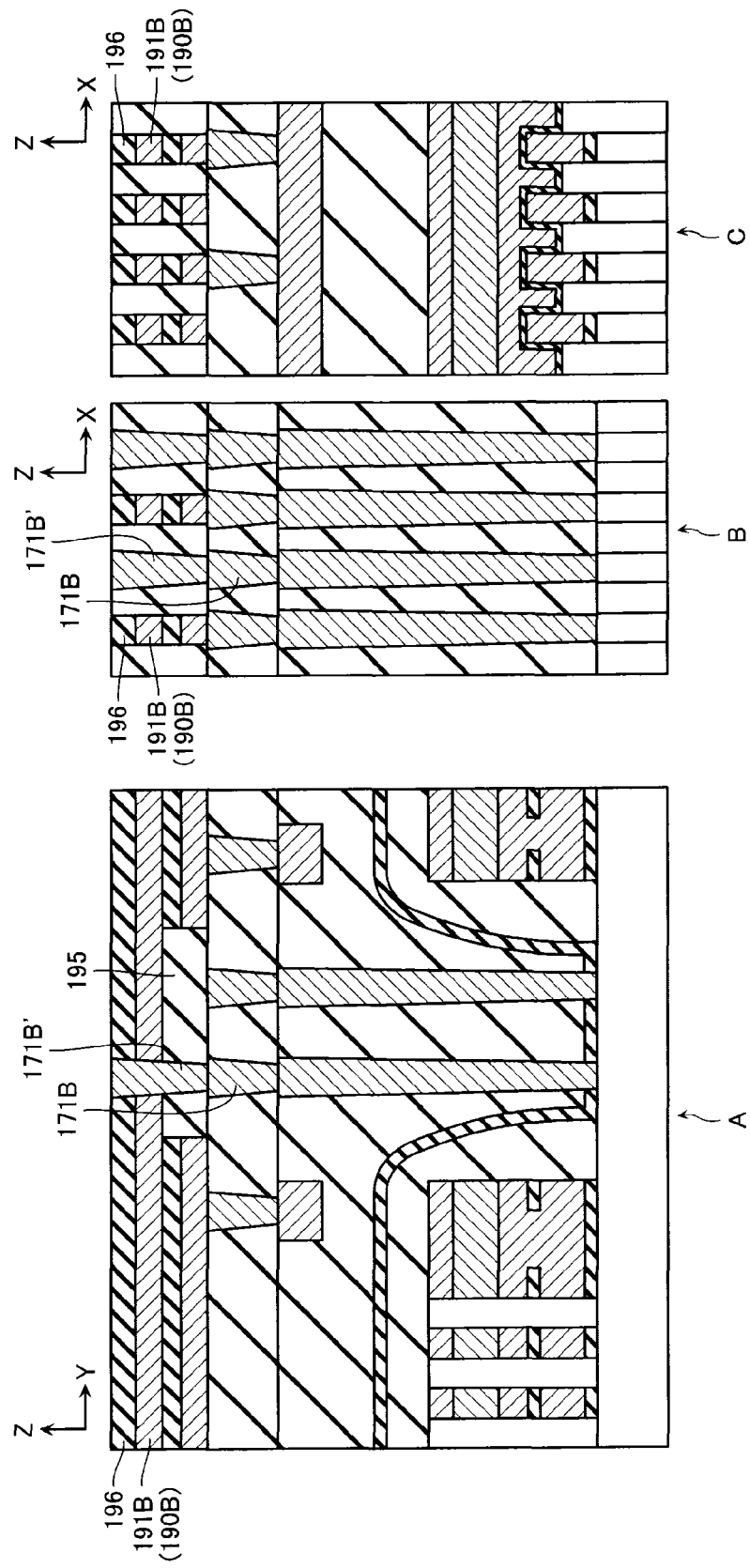

Next, as shown in FIG. 20, a via 171B' penetrating the upper layer conductive layer 190B and the inter-layer insulating layers 195 and 196 to reach an upper surface of the via 171B, is formed at a position of the via 171B. As a result, the bit line BL (191B) contacting a side surface of the via 171B', is formed.

Figure 21:
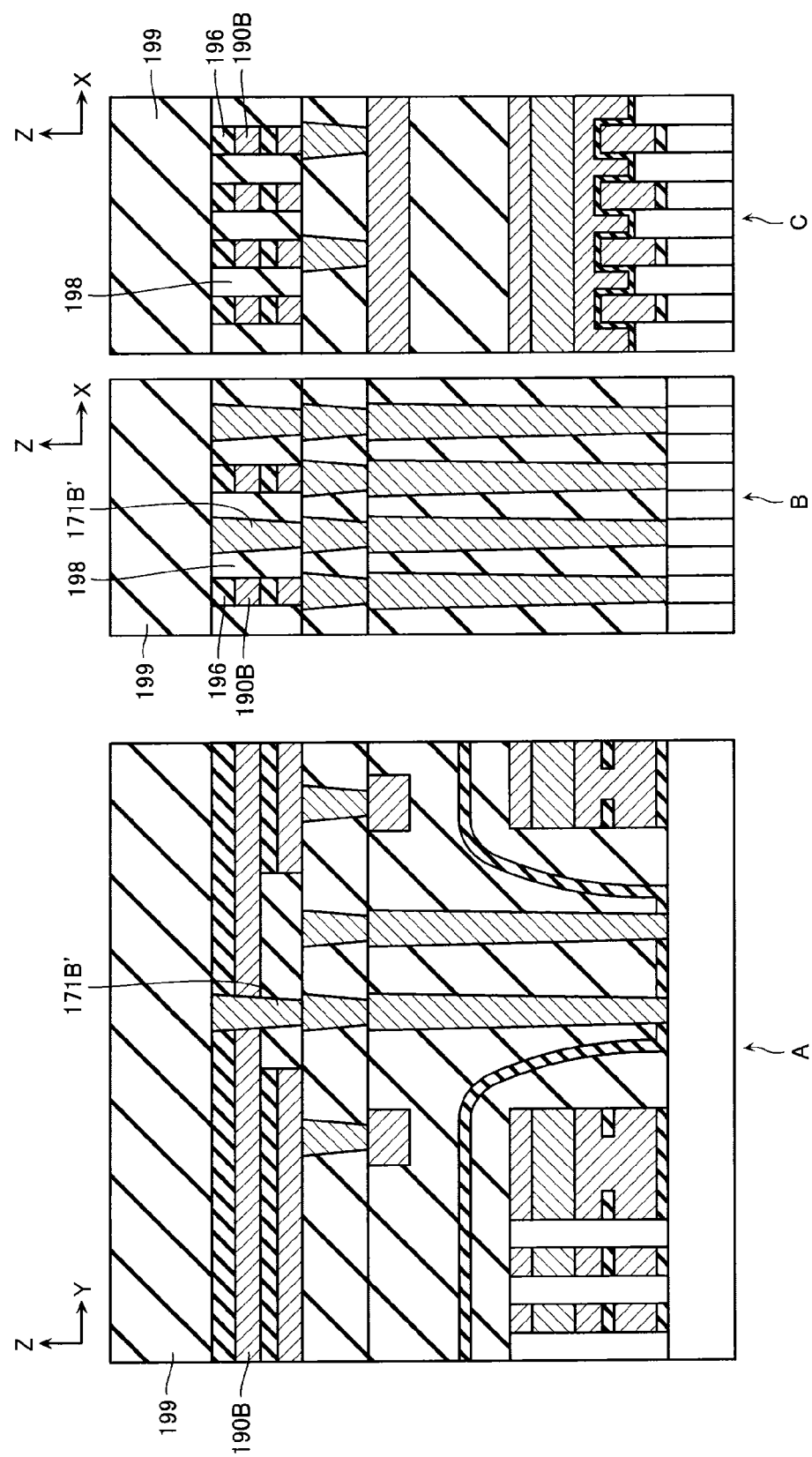

Finally, as shown in FIG. 21, an inter-layer insulating layer 199 is stacked above the via 171B', the upper layer conductive layer 190B, and the inter-layer insulating layer 198.

Described thus far are some of the production steps of the memory cell array 1.

Compared to a general flow for producing the memory cell array 200 of the comparative example, the above-described production steps result in the addition of processes such as division of the dummy bit line DBL (192A) or formation of the via 171B'. However, even in this case, suppression of an increase in processes can be achieved by having the bit lines BL (191A and 191B) and the dummy bit lines DBL (192A and 192B) of the two upper layer wiring line layers M1A and M1B formed in a batch (refer to FIG. 18).

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
in the case that three directions intersecting each other are assumed to be a first direction, a second direction, and a third direction,
a memory cell array including a plurality of memory cells and a first wiring line layer and second wiring line layer disposed sequentially above the memory cells in the third direction, the first wiring line layer including a first wiring line and a first dummy wiring line that are aligned in the first direction and have the second direction as a longer direction, and the second wiring line layer including a second wiring line and a second dummy wiring line that are aligned in the first direction and have the second direction as a longer direction; and
a control circuit that controls an access operation on the memory cells,
the first wiring line layer including a plurality of the first wiring lines and a plurality of the first dummy wiring lines aligned alternately one at a time in the first direction,
the second wiring line layer including a plurality of the second wiring lines and a plurality of the second dummy wiring lines aligned alternately one at a time in the first direction, and
during the access operation by the control circuit, the first wiring line being electrically connected to one of the memory cells, the second wiring line being electrically connected to another of the memory cells, and the first dummy wiring line and the second dummy wiring line being fixed at a certain first potential.

2. The semiconductor memory device according to claim 1, wherein the first potential is a ground potential.

3. The semiconductor memory device according to claim 1, wherein
the memory cell array includes a first via contacting the second wiring line and extending in the third direction from the second wiring line to a side of the memory cells, and
the first dummy wiring line is divided in a disposition region of the first via.

4. The semiconductor memory device according to claim 3, wherein the first via is a columnar body having the third direction as a longer direction, and the first via contacts the second wiring line at a side surface.

5. The semiconductor memory device according to claim 1, wherein the memory cell array includes an intermediate electrode at an intermediate position of the memory cells and the first wiring line layer in the third direction, the intermediate electrode being set to the first potential.

6. The semiconductor memory device according to claim 5, wherein the memory cell array includes a second via, the second via contacting the first dummy wiring line and the intermediate electrode.

7. A semiconductor memory device, comprising:
in the case that three directions intersecting each other are assumed to be a first direction, a second direction, and a third direction,
a memory cell array including a plurality of memory cells connected in series and a word line layer, first bit line layer, and second bit line layer disposed sequentially above the memory cells in the third direction, the word line layer including a plurality of word lines that function as control gates of the memory cells, the first bit line layer including a first bit line and a first dummy bit line that are aligned in the first direction and have the second direction as a longer direction, and the second bit line layer including a second bit line and a second dummy bit line that are aligned in the first direction and have the second direction as a longer direction; and
a control circuit that controls an access operation on the memory cells,
the first bit line layer including a plurality of the first bit lines and a plurality of the first dummy bit lines aligned alternately one at a time in the first direction,
the second bit line layer including a plurality of the second bit lines and a plurality of the second dummy bit lines aligned alternately one at a time in the first direction, and
during the access operation by the control circuit, the first bit line being electrically connected to one of the memory cells, the second bit line being electrically connected to another of the memory cells, and the first dummy bit line and the second dummy bit line being fixed at a certain first potential.

8. The semiconductor memory device according to claim 7, wherein the first potential is a ground potential.

9. The semiconductor memory device according to claim 7, wherein
the memory cell array includes a first via contacting the second bit line and extending in the third direction from the second bit line to a side of the memory cells, and
the first dummy bit line is divided in a disposition region of the first via.

10. The semiconductor memory device according to claim 9, wherein the first via is a columnar body having the third direction as a longer direction, and the first via contacts the second bit line at a side surface.

11. The semiconductor memory device according to claim 7, wherein the memory cell array includes an intermediate electrode at an intermediate position of the word line layer and the first bit line layer in the third direction, the intermediate electrode being set to the first potential.

12. The semiconductor memory device according to claim 11, wherein the memory cell array includes a second via, the second via contacting the first dummy bit line and the intermediate electrode.

13. The semiconductor memory device according to claim 7, wherein
the second bit line is disposed at the same position in the first direction as the first dummy bit line, and the second dummy bit line is disposed at the same position in the first direction as the first bit line.

14. A semiconductor memory device comprising:
in the case that three directions intersecting each other are assumed to be a first direction, a second direction, and a third direction,
a memory cell array including a plurality of memory cells and a first wiring line layer and second wiring line layer disposed sequentially above the memory cells in the third direction, the first wiring line layer including a first wiring line and a first dummy wiring line that are aligned in the first direction and have the second direction as a longer direction, and the second wiring line layer including a second wiring line and a second dummy wiring line that are aligned in the first direction and have the second direction as a longer direction; and
a control circuit that controls an access operation on the memory cells,
the second wiring line being disposed at the same position in the first direction as the first dummy wiring line,
the second dummy wiring line being disposed at the same position in the first direction as the first wiring line, and
during the access operation by the control circuit, the first wiring line being electrically connected to one of the memory cells, the second wiring line being electrically connected to another of the memory cells, and the first dummy wiring line and the second dummy wiring line being fixed at a certain first potential.

15. The semiconductor memory device according to claim 14, wherein the first potential is a ground potential.

16. The semiconductor memory device according to claim 14, wherein
the first wiring line layer includes a plurality of the first wiring lines and a plurality of the first dummy wiring lines aligned alternately one at a time in the first direction, and
the second wiring line layer includes a plurality of the second wiring lines and a plurality of the second dummy wiring lines aligned alternately one at a time in the first direction.

17. The semiconductor memory device according to claim 14, wherein
the memory cell array includes a first via contacting the second wiring line and extending in the third direction from the second wiring line to a side of the memory cells, and
the first dummy wiring line is divided in a disposition region of the first via.

18. The semiconductor memory device according to claim 17, wherein the first via is a columnar body having the third direction as a longer direction, and the first via contacts the second wiring line at a side surface.

19. The semiconductor memory device according to claim 14, wherein the memory cell array includes an intermediate electrode at an intermediate position of the memory cells and the first wiring line layer in the third direction, the intermediate electrode being set to the first potential.

20. The semiconductor memory device according to claim 19, wherein the memory cell array includes a second via, the second via contacting the first dummy wiring line and the intermediate electrode.

* * * * *